(12) United States Patent
Youngner et al.

(10) Patent No.: US 7,494,598 B2
(45) Date of Patent: Feb. 24, 2009

(54) MINIATURE OPTICALLY TRANSPARENT WINDOW

(75) Inventors: Daniel W. Youngner, Maple Grove, MN (US); Son T. Lu, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 438 days.

(21) Appl. No.: 11/164,445

(22) Filed: Nov. 22, 2005

(65) Prior Publication Data

US 2008/0296257 A1  Dec. 4, 2008

(51) Int. Cl.
*G01R 31/00* (2006.01)
(52) U.S. Cl. .............................. 216/60; 216/67; 216/72; 216/79
(58) Field of Classification Search .................... 216/60, 216/72, 79, 67; 438/700
See application file for complete search history.

(56) References Cited

U.S. PATENT DOCUMENTS

| | | | |
|---|---|---|---|
| 4,973,133 A | 11/1990 | Matz et al. | |
| 6,333,942 B1 | 12/2001 | Nakazawa et al. | |
| 6,570,459 B1 | 5/2003 | Nathanson et al. | |
| 6,808,956 B2 | 10/2004 | Cabuz et al. | |
| 6,900,702 B2 | 5/2005 | Youngner et al. | |
| 2004/0084395 A1 | 5/2004 | Youngner et al. | |
| 2004/0223240 A1* | 11/2004 | Huibers | 359/850 |
| 2004/0244502 A1 | 12/2004 | Youngner et al. | |
| 2005/0046922 A1* | 3/2005 | Lin et al. | 359/291 |
| 2005/0258365 A1* | 11/2005 | Bloess et al. | 250/309 |
| 2006/0051584 A1* | 3/2006 | Bieck et al. | 428/408 |
| 2006/0060766 A1* | 3/2006 | Turner et al. | 250/251 |
| 2006/0077123 A1* | 4/2006 | Gally et al. | 345/32 |

* cited by examiner

*Primary Examiner*—Binh X Tran
(74) *Attorney, Agent, or Firm*—Black Lowe & Graham PLLC

(57) ABSTRACT

Miniature optically transparent windows are disclosed that extend vertically from a plane, which may be used to transmit light traveling in a direction substantially parallel with the plane. In one illustrative embodiment, a method for forming such miniature optically transparent windows includes: providing a substrate having a first surface and an opposing second surface, the substrate having a first layer and an adjacent second layer; forming a recess in the first layer of the substrate, the recess extending to the second layer; providing an optically transparent material in the recess to form an optically transparent feature; and removing at least a portion of the first layer that extends adjacent the optically transparent feature so that light can pass through the optically transparent feature in a direction that is substantially parallel to the first surface of the substrate.

27 Claims, 9 Drawing Sheets

MINIATURE OPTICALLY TRANSPARENT WINDOW

GOVERNMENT SUPPORT

This invention was made with government support under DARPA contract number N66001-02-C-8019. The government may have certain rights in the invention.

BACKGROUND

The present invention generally relates to miniature optically transparent windows.

Many MEMS structures require that light be shines into and through them. One example of such a device is a chip-scale atomic clock as described in U.S. Pat. No. 6,900,702. Recent trends have emphasized ultra compact, high performance architectures such as these MEMS based devices, which often utilize semiconductor fabrication techniques to form miniaturized components on the surface of a wafer. However, semiconductor fabrication techniques are often limited in forming some MEMS structures, such as miniature windows that are transparent in the horizontal direction (e.g. a direction parallel to the surface of the wafer). In some cases, horizontally transparent windows have been fabricated by bonding a transparent structure, as a Pyrex™ glass structure, onto a top and/or bottom surface of a MEMS wafer. While these devices can operate satisfactory, fabrication improvements are desired.

SUMMARY

The present invention generally relates to miniature optically transparent windows. In one illustrative embodiment, a method for forming miniature optically transparent windows is described. This illustrative method may include the steps of: providing a substrate having a first surface and an opposing second surface, the substrate having a first layer and an adjacent second layer; forming a recess in the first layer of the substrate, the recess extending to the second layer; providing an optically transparent material in the recess to form an optically transparent feature; and removing at least a portion of the first layer that extends adjacent the optically transparent feature so that light can pass through the optically transparent feature in a direction that is substantially parallel to the first surface of the substrate.

In some cases, the starting substrate may be a Silicon-On-Insulator (SOI) wafer, which includes a relatively thicker silicon substrate, a relatively thin oxide layer, followed by a relatively thin silicon layer. The first layer in the illustrative method just described may correspond to the relatively thicker silicon substrate, and the second layer may correspond to the relatively thin oxide layer, but this is not required.

In some cases, one or more support layers may be coated on the walls of the recess before the optically transparent material is provided in the recess. The one or more support layers may also extend between spaced optically transparent windows. The one or more support layers may provide additional support to the optically transparent windows. The support layers may also help during the manufacturing process of the optically transparent windows by, for example, providing an etch stop layer, but this is not required.

In another illustrative embodiment, a plurality of optically transparent windows is provided. The plurality of optically transparent windows may extend substantially parallel to one another and vertically up from a plane. The optically transparent windows are preferably capable of transmitting light in a horizontal direction that is substantially parallel to the plane. The plurality of optically transparent windows may include a plurality of optically transparent features spaced from one another, with side walls that extend substantially parallel to one another and vertically from the plane. An optically transparent support layer may extend over at least part of the side walls of the plurality of optically transparent features, as well as along the plane between the optically transparent features.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

The invention may be more completely understood in consideration of the following detailed description of various embodiments of the invention in connection with the accompanying drawings, in which.

Figure 1A:
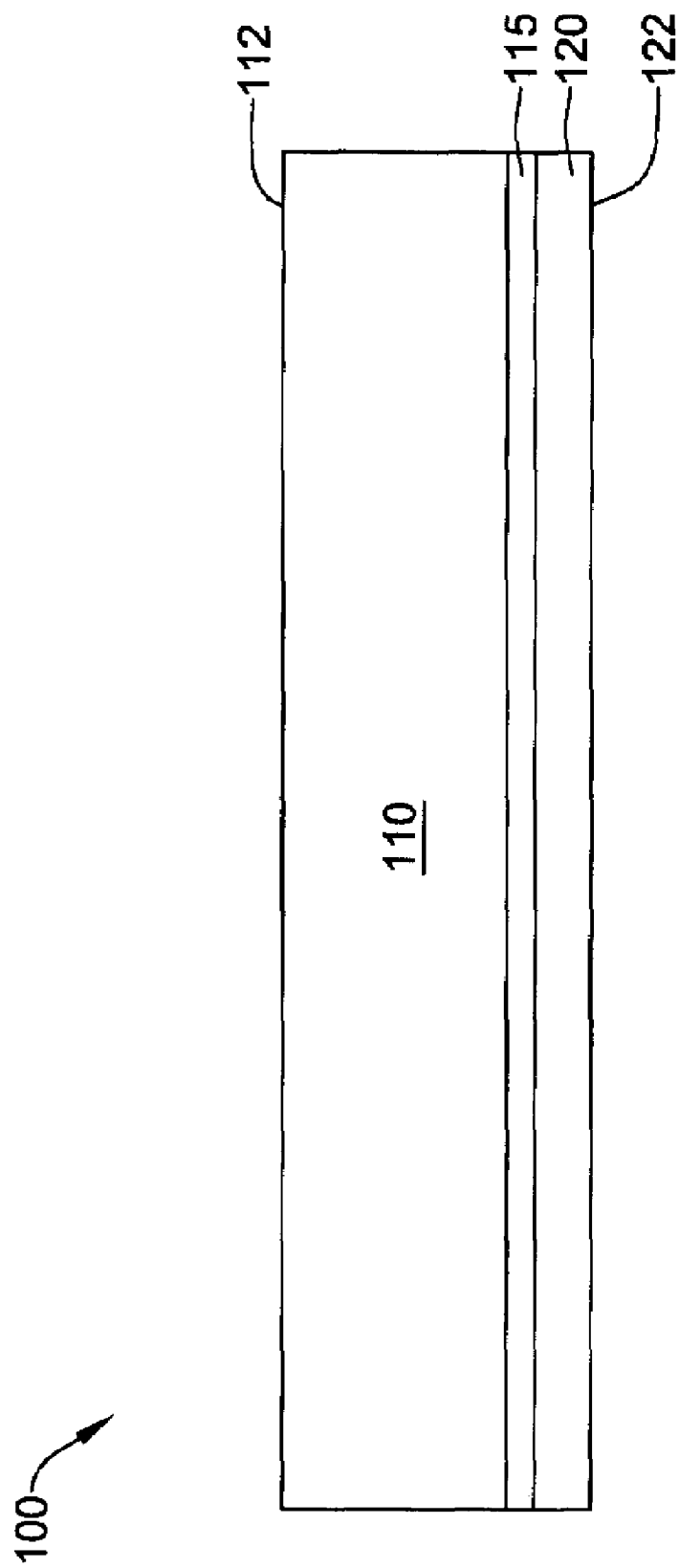
FIGS. 1A-1I are schematic representations showing an illustrative method of fabricating optically transparent windows in accordance with the present invention.

While the invention is amenable to various modifications and alternative forms, specifics thereof have been shown by way of example in the drawings and will be described in detail. It should be understood, however, that the intention is not to limit the invention to the particular illustrative embodiments described. On the contrary, the intention is to cover all modifications, equivalents, and alternatives falling within the spirit and scope of the invention.

DETAILED DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials may be illustrated for the various elements, those skilled in the art will recognize that many of the examples provided have suitable alternatives that may be utilized.

Generally, the present invention relates to miniature optically transparent windows. One illustrative embodiment includes methods for forming miniature horizontally optically transparent windows. These horizontally optically transparent windows are useful in any device that uses light traveling parallel to a major surface of a substrate and pass through the optically transparent window. One example of such a device is an atomic device such as, for example, chip-scale atomic clocks, atomic magnetometers, and atomic gyroscopes to name a few. Other optical device, such as those often used in the telecommunications and other industries, may also benefit.

FIGS. 1A-1I are schematic representations showing a method of fabricating optically transparent windows in accordance with an illustrative embodiment of the present invention. In the illustrative method, and referring to FIG. 1A, a silicon wafer 100 having a first surface 112 and a substantially co-planar second surface 122 is illustrated. While a silicon wafer is shown, it is contemplated that the silicon wafer may be any suitable substrate. In some embodiments, the silicon wafer 100 can be formed from one or more silicon and/or oxides of silicon layers. For example, the silicon wafer 100 may include a relatively thin silicon oxide (SiO$_2$) layer 115 disposed between a relatively thicker first silicon layer 110 and a relatively thin second silicon layer 120. In many embodiments, the first silicon layer 110 has a thickness in a range from 100 to 1000 micrometers or from 250 micrometers to 750 micrometers, the second silicon layer 120 has a thickness in a range from 10 to 100 micrometers or from 20 micrometers to 50 micrometers, and the silicon oxide layer 115 has a thickness in a range from 1 to 10 micrometers or from 1 micrometers to 5 micrometers. In some cases, the a relatively thin silicon oxide (SiO$_2$) layer 115, the relatively thicker first silicon layer 110 and the relatively thin second silicon layer 120 may be a Silicon-On-Insulator (SOI) wafer. However, it is contemplated that the layers 110, 115, and 120 can have any useful thicknesses and any number of layers, and can be formed from any suitable material or material system, depending on the application.

Figure 1B:
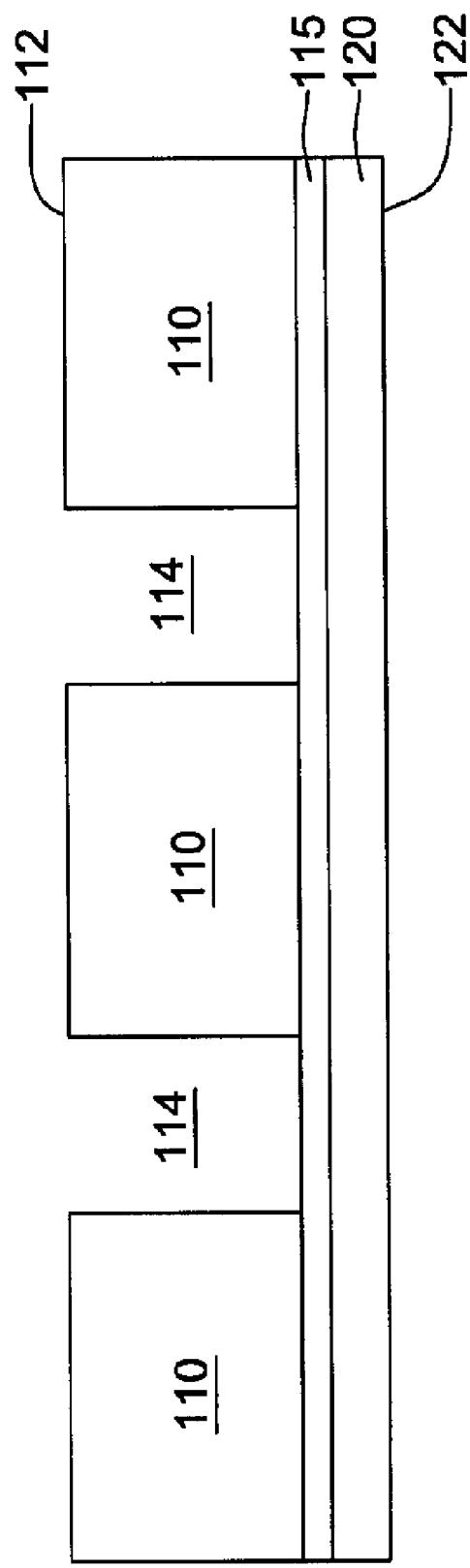

In the illustrative embodiment, one or more recesses 114 are formed in the first silicon layer 110. The one or more recesses 114 may extend to the silicon oxide layer 115, as illustrated in FIG. 1B, but this is not required. When so provided, the silicon oxide layer 115 may, in some cases, function as an etch stop layer. Thus, in the illustrative embodiment, the one or more recesses 114 may independently each have a depth from 100 to 1000 micrometers or from 250 to 750 micrometers, depending on the thickness of the first silicon layer 100.

The one or more recesses 114 can have any useful width. In some embodiments, the one or more recesses 114 independently each have a width in a range from 25 to 150 micrometers or from 50 to 100 micrometers, depending on application. In one embodiment, the recesses 114 are formed by photopatterning a patterned mask on the first surface 112 of the first silicon layer 100, and then etching the recesses 114 using a Deep-Reactive-Ion-Etch (DRIE). However, other techniques may be used to form the recesses 114, as desired.

Figure 1C:
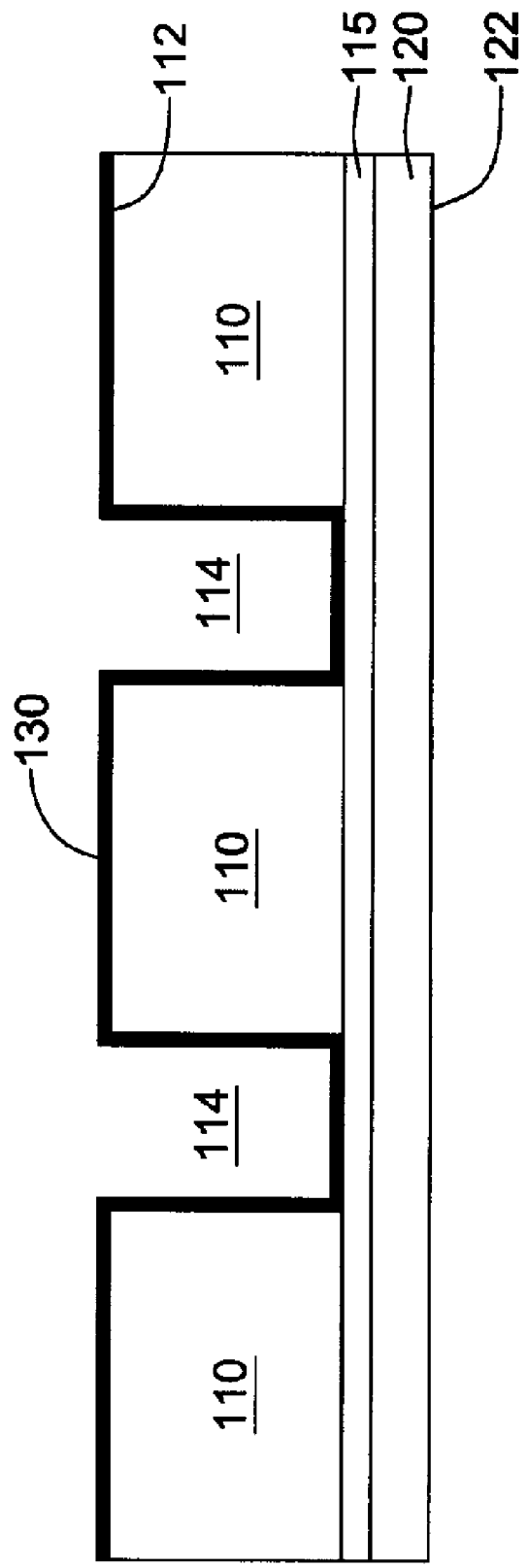

In some embodiments, and referring now to FIG. 1C, a layer of silicon nitride 130 can be disposed on the first surface 112 and on the side walls of the one or more recesses 114, but this is not required. In some embodiments, the layer of silicon nitride 130 has a thickness in a range from 0.01 to 1 micrometer, but other thicknesses can be used. The layer of silicon nitride 130 can be provided using any number of known techniques.

Figure 1D:
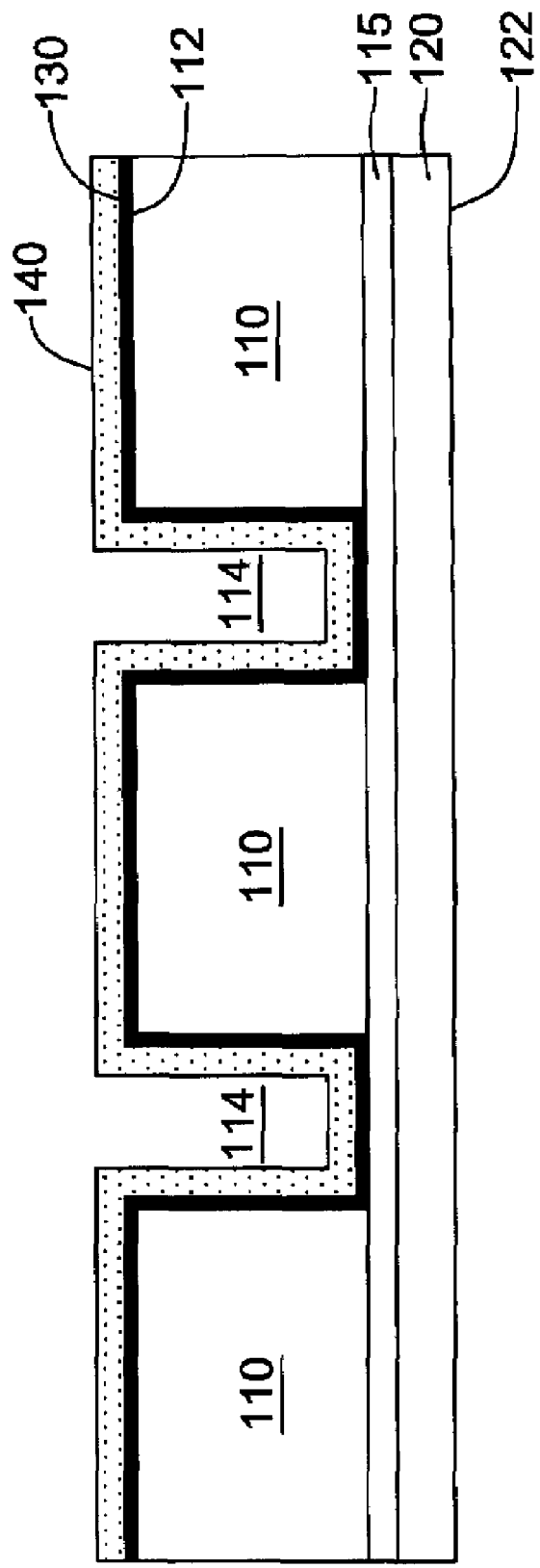

Next, and as shown in FIG. 1D, a layer of silicon oxide 140 may be provided on the optional silicon nitride layer 130, or directly on the first surface 112 and the side walls of the one or more recesses 114, as desired. In many embodiments, the layer of silicon oxide 140 has a thickness in a range from 1 to 5 micrometer, but other thicknesses may be used. The layer of silicon oxide 140 can be provided using any number of known techniques.

Figure 1E:
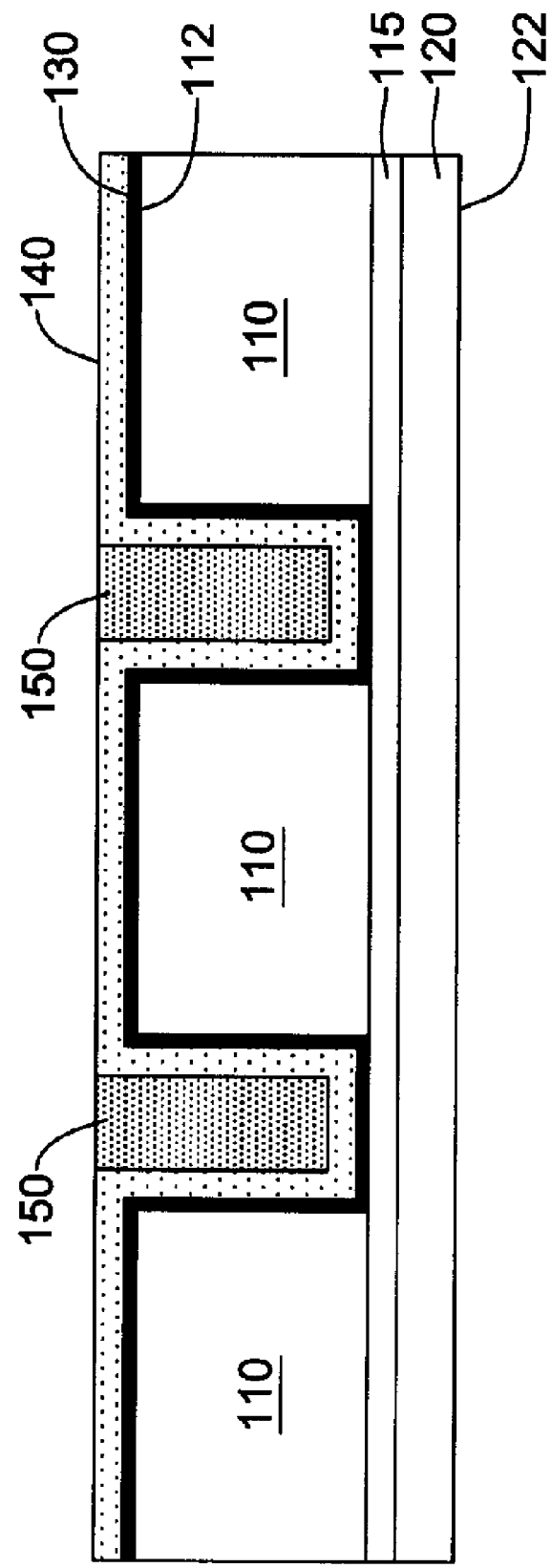

In the illustrative embodiment, an optically transparent material 150 may then be disposed within the recesses 114, as shown in FIG. 1E. The optically transparent material 150 can be disposed within the recesses 114 using known techniques. In many embodiments, the optically transparent material 150 is a polymeric material. In some embodiments, the optically transparent material 150 is a polymeric material that can be cured or cross-linked and is stable at the fabrication temperature, such as above 200 degrees centigrade, for example. In one embodiment, the material is an epoxy polymer sold under the tradename SU-8, and is polymerizable by cationic photopolymerization, such as is described in U.S. Pat. No. 4,882,245.

The optically transparent material 150 can have any useful optical properties, depending on application. In many embodiments, the optically transparent material 150 allows 90% or greater incident light to pass (transmit) through the optically transparent material 150. In some embodiments, the optically transparent material 150 allows 95% or greater incident light to pass (transmit) through the optically transparent material 150. In other embodiments, the optically transparent material 150 allows 98% or greater incident light to pass (transmit) through the optically transparent material 150. The incident light can be any desired wavelength. In some embodiments, the incident light has a wavelength in the visible light spectrum. In other embodiment, the incident light has a wavelength in the infrared light spectrum. In some embodiments, the incident light has a wavelength in a range from 700 to 900 nanometers. In some embodiments, the incident light has a wavelength in a range from 750 to 800 nanometers.

Figure 1F:
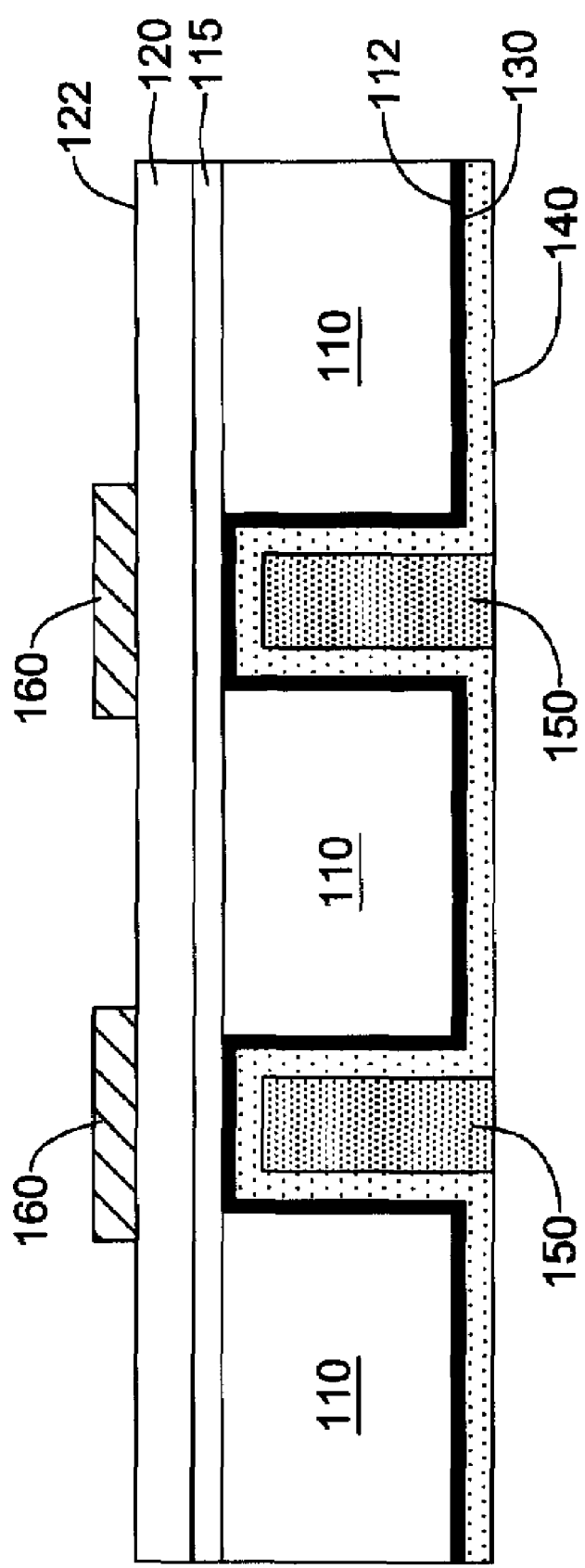
Figure 1G:
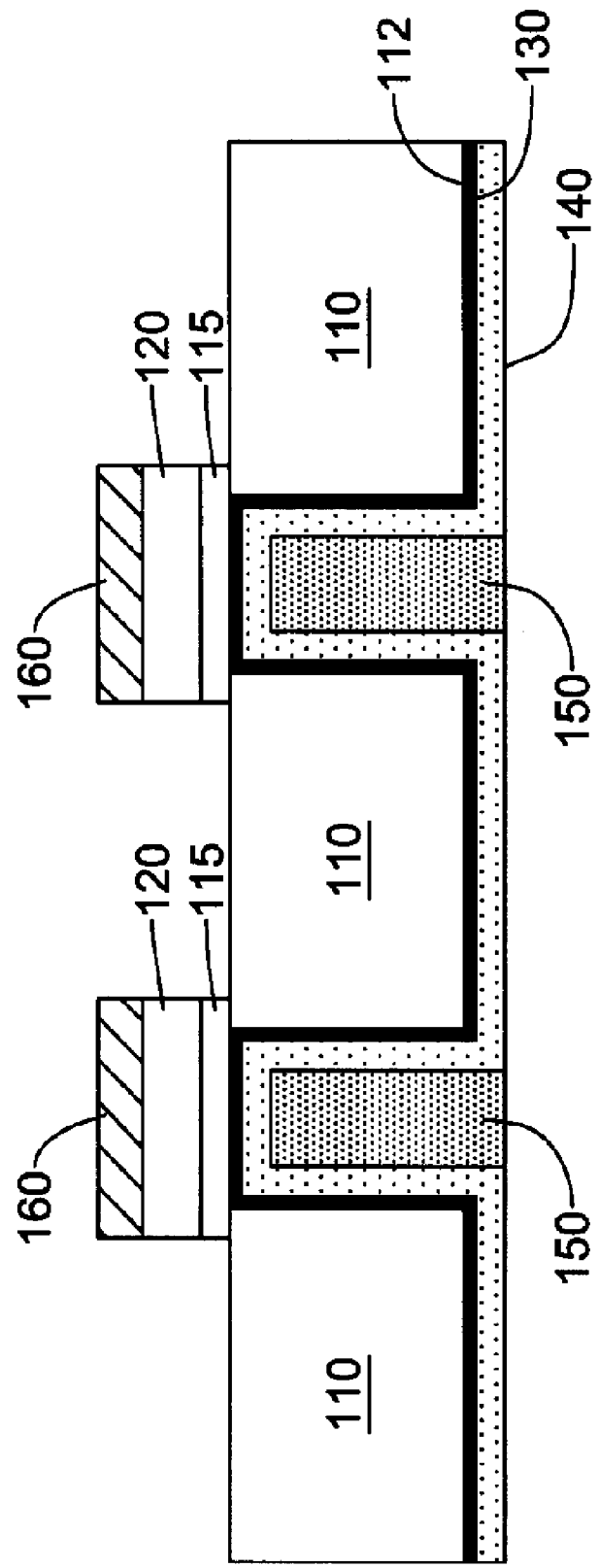
Figure 1H:
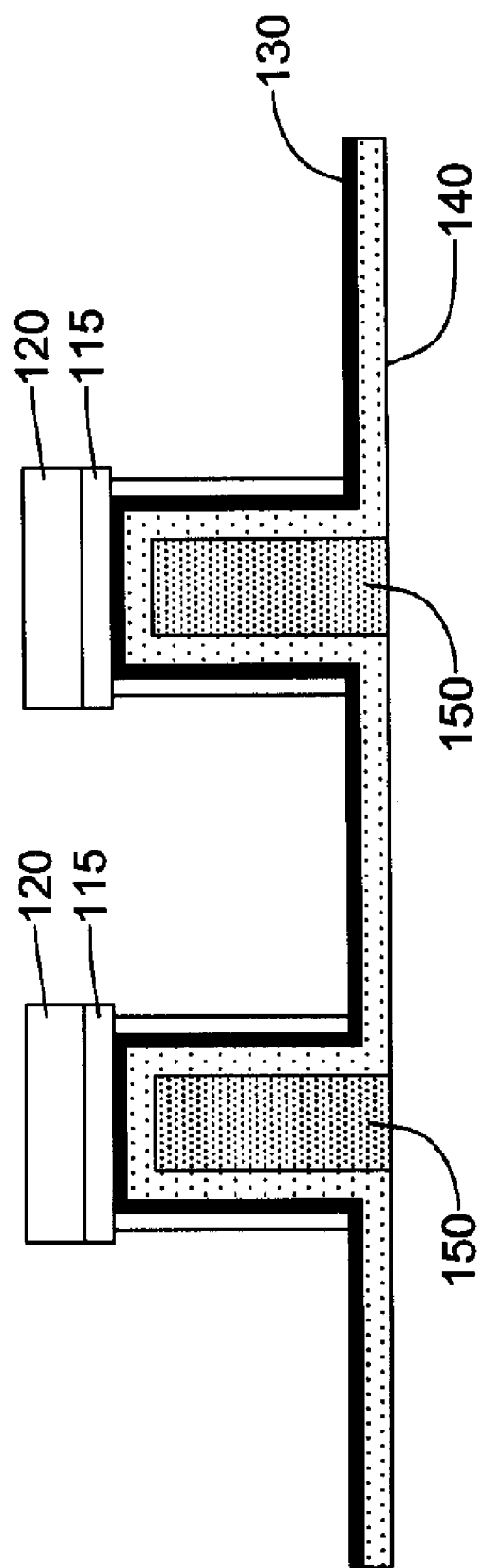

Referring to FIG. 1F, photo mask elements 160 may be placed and/or patterned on the second surface 122, and in vertical registration with one or more recesses 114. The photo mask elements 160 may, in some cases, extend laterally beyond the optically transparent material 150 and slightly beyond the optional silicon nitride layer 130 and/or the silicon oxide layer 140 that was previously provided on the sidewalls of the one or more recesses 114, if desired. Next, the second layer of silicon 120 and the silicon oxide layer 115 may be removed via photolithography or etching by known techniques, leaving those portions of the second layer of silicon 120 and the silicon oxide (SiO$_2$) layer 115 that are in vertical registration with the one or more recesses 114 and the photo mask elements 160, as shown in FIG. 1G. Then, the first silicon layer 110 can be removed with a Deep-Reactive-Ion-Etch (DRIE), for example, as shown in FIG. 1H. In many embodiments, the entire the first silicon layer 110 is removed, but this is not required. Alternatively, it is contemplated that the second layer of silicon 120, the silicon oxide layer 115 and the first silicon layer 110 may be removed in one step via photolithography or etching by known techniques, leaving those portions of the second layer of silicon 120 and the silicon oxide (SiO$_2$) layer 115 that are in vertical registration with the one or more recesses 114 and the photo mask elements 160.

Figure 1I:
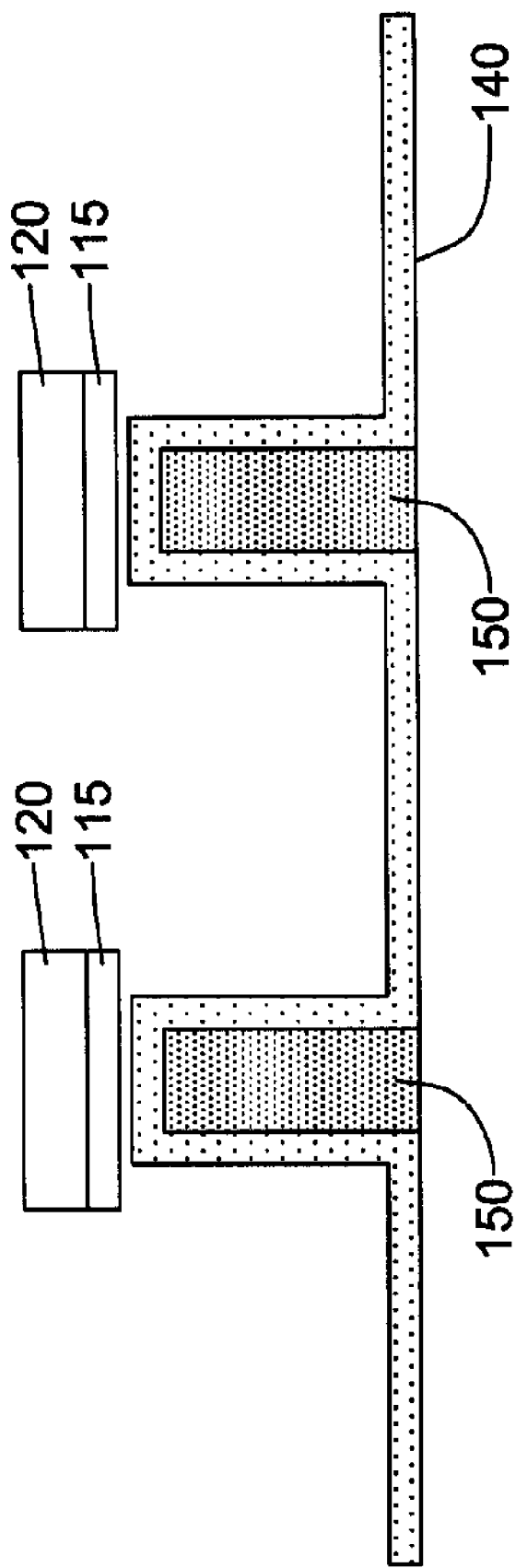

FIG. 1I illustrated a completed window formation. If present, the optional silicon nitride layer 130 can be removed and any remaining silicon from the first silicon layer 110 can be removed via known etch techniques. During this step, the remaining second silicon layer 120 and silicon oxide layer 115 can also be removed from the top of the transparent window 150, if desired, or one or more other steps may be used to remove the remaining second silicon layer 120 and silicon oxide layer 115 from the top of the transparent window 150, if desired. In some embodiments, the process may include removing at least part of the oxide layer that was provided along the walls of the recess, after a portion of the first layer that extends adjacent to the optically transparent feature is removed. In other embodiments, the process may include removing at least part of the oxide layer and the silicon nitride layer that were provided along the walls of the recess, after a portion of the first layer that extends adjacent to the optically transparent feature is removed.

In many embodiments, at least a portion of the completed window structure 150 extends orthogonally away from a plane defined by the silicon oxide layer 140. This may allow light to travel parallel to the plane defined by the silicon oxide layer 140 and transmit horizontally through the window structure 150.

These optically transparent window structures 150 can then be utilized in the formation of many devices such as, for example, atomic sensors including atomic clocks, atomic magnetometers, and atomic gyroscopes. An example of an atomic device where these optically transparent windows are useful is described in U.S. Pat. No. 6,900,702. Other optical device, such as those often used in the telecommunications and other industries, may also benefit.

The resulting stricture may include a plurality of optically transparent windows extending substantially parallel to one another and vertically up from a plane, wherein the optically transparent windows are capable of transmitting light in a horizontal direction that is substantially parallel to the plane. More specifically, there may be a plurality of optically transparent features 150 that are spaced from one another and may have side walls that extend substantially parallel to one another and vertically from the plane defined by, for example, the silicon oxide layer 140 and/or the nitride layer 130. An optically transparent support layer, such as the silicon oxide layer 140 and/or the silicon nitride layer 130, may extending over at least part of the side walls of the plurality of optically transparent features 150, as well as along the plane between the optically transparent features 150, as shown.

The present invention should not be considered limited to the particular examples described above, but rather should be understood to cover all aspects of the invention as fairly set out in the attached claims. Various modifications, equivalent processes, as well as numerous structures to which the present invention can be applicable will be readily apparent to those of skill in the art to which the present invention is directed upon review of the instant specification.

What is claimed is:

1. A method for forming a transparent window, comprising:
   providing a substrate having a first surface and an opposing second surface, the substrate having a first layer and an adjacent second layer;
   forming a recess in the first layer of the substrate, the recess extending to the second layer;
   providing an optically transparent material in the recess to form an optically transparent feature; and
   removing at least a portion of the first layer that extends adjacent the optically transparent feature so that light can pass through the optically transparent feature in a direction that is substantially parallel to the first surface of the substrate.

2. The method of claim 1 wherein the providing comprises filling the recess with an optically transparent polymeric material.

3. The method of claim 1 wherein the optically transparent material is an optically transparent epoxy-based polymeric material.

4. The method of claim 1 wherein the optically transparent material has a visible light transmission of 95% or greater.

5. The method of claim 1 wherein the optically transparent material has a light transmission of 95% or greater at a light wavelength in a range from 700 to 900 nanometers.

6. The method of claim 1 further comprising transmitting light substantially parallel to the first surface of the substrate and through the optically transparent feature.

7. The method of claim 1 wherein the recess is formed in the first layer of the substrate using a Deep-Reactive-Ion-Etch.

8. The method of claim 1 wherein the first layer includes silicon, and the second layer includes an oxide.

9. The method of claim 8 further comprising a third layer situated adjacent to the second layer opposite to the first layer, wherein the third layer includes silicon.

10. The method of claim 1 further comprising providing an oxide layer along the walls of the recess before providing the optically transparent material in the recess.

11. The method of claim 10 further comprising removing at least part of the oxide layer that was provided along the walls of the recess, after the at least a portion of the first layer that extends adjacent to the optically transparent feature is removed.

12. The method of claim 10 further comprising providing a silicon nitride layer along the walls of the recess before providing the oxide layer along the walls of the recess.

13. The method of claim 12 further comprising removing at least part of the oxide layer and the silicon nitride layer that were provided along the walls of the recess, after the at least a portion of the first layer that extends adjacent to the optically transparent feature is removed.

14. The method of claim 12 further comprising providing a photo mask element adjacent to the second layer opposite to the first layer, the photo mask element in registration with the recess.

15. The method of claim 14 further comprising using the photo mask element to selectively remove portions of the second layer of the substrate that are not protected by the photo mask element.

16. The method of claim 15 further comprising using the photo mask element and/or the remaining portions of the second layer to provide a mask to selectively remove the first layer of the substrate that is not under the photo mask element an/or the remaining portions of the second layer.

17. The method of claim 16 wherein the first layer of the substrate that is not under the photo mask element and/or the remaining portions of the second layer is selectively removed using a Deep-Reactive-Ion-Etch.

18. A method forming a transparent window, comprising:
   providing a substrate having a first substantially planar surface and an opposing second substantially planar surface, the silicon substrate having a silicon oxide layer, having a thickness in a range from 1 to 5 micrometers, disposed between a first silicon layer, having a thickness in a range from 250 to 750 micrometers, and a second silicon layer, having a thickness in a range from 20 to 50 micrometers;
   forming a recess in the first silicon layer of the substrate, the recess extending to the silicon oxide layer;
   providing an optically transparent material in the recess to form an optically transparent feature; and
   removing at least a portion of the first silicon layer that extends adjacent the optically transparent feature so that light can pass through the optically transparent feature in a direction that is substantially parallel to the first substantially planar surface of the substrate.

19. The method of claim 18, wherein the removing comprises:
   providing a mask element on the second silicon layer in registration with the recess;
   removing the second silicon layer and the silicon using the mask element; and
   removing at least part of the first silicon layer using the mask element.

20. The method of claim 19 further comprising:
   providing an oxide layer along the walls of the recess before providing the optically transparent material in the recess.

21. The method of claim 20 further comprising removing the oxide layer that was provided along the walls of the recess, after the at least part of the first silicon layer is removed, to expose a side wall of the optically transparent feature.

22. The method of claim 20, wherein the first silicon layer has a surface that corresponds to the first substantially planar surface of the substrate and the second silicon layer has a surface that corresponds to the second substantially planar surface of the substrate, and wherein the oxide layer is provided along the walls of the recess and along the surface of the first silicon layer that corresponds to the first substantially planar surface of the substrate.

23. The method of claim 21 wherein the at least part of the first silicon layer is removed using the mask element down to the silicon.

24. The method of claim 20 further comprising providing a silicon nitride layer along the walls of the recess before providing the oxide layer along the walls of the recess.

25. The method of claim 24 further comprising removing the oxide layer and the silicon nitride layer that were provided along the walls of the recess, after the at least part of the first silicon layer is removed, to expose a side wall of the optically transparent feature.

26. The method of claim 24, wherein the first silicon layer has a surface that corresponds to the first substantially planar surface of the substrate and the second silicon layer has a surface that corresponds to the second substantially planar surface of the substrate, and wherein the silicon nitride layer and the oxide layer are provided along the walls of the recess and along the surface of the first silicon layer that corresponds to the first substantially planar surface of the substrate.

27. The method of claim 26 wherein the at least part of the first silicon layer is removed using the mask element down to the silicon nitride layer.

* * * * *

UNITED STATES PATENT AND TRADEMARK OFFICE
CERTIFICATE OF CORRECTION

| | | |
|---|---|---|
| PATENT NO. | : 7,494,598 B2 | Page 1 of 1 |
| APPLICATION NO. | : 11/164445 | |
| DATED | : February 24, 2009 | |
| INVENTOR(S) | : Youngner et al. | |

It is certified that error appears in the above-identified patent and that said Letters Patent is hereby corrected as shown below:

At Claim 19, Column 6, Line 56, replace "the silicon using" with --the silicon oxide layer using--

At Claim 23, Column 7, Line 11, replace "the silicon." with --the silicon oxide layer.--

Signed and Sealed this
Twenty-third Day of August, 2011

David J. Kappos
*Director of the United States Patent and Trademark Office*